(12) United States Patent
Lin (10) Patent No.: US 10,673,606 B1
(45) Date of Patent: Jun. 2, 2020

(54) HIGH-SPEED FULL-DUPLEX TRANSCEIVER AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/253,343

(22) Filed: Jan. 22, 2019

(51) Int. Cl.
| | |
|---|---|
| H04L 5/14 | (2006.01) |
| H03F 3/45 | (2006.01) |
| H03M 1/12 | (2006.01) |
| H03M 1/66 | (2006.01) |

(52) U.S. Cl.
CPC ....... H04L 5/1461 (2013.01); H03F 3/45475 (2013.01); H03M 1/12 (2013.01); H03M 1/66 (2013.01)

(58) Field of Classification Search
CPC .................................................... H04L 5/1461
See application file for complete search history.

(56) References Cited

U.S. PATENT DOCUMENTS

| | | | | |
|---|---|---|---|---|
| 7,649,483 B1* | 1/2010 | Sutardja | ............... | H03M 1/661 341/143 |
| 9,312,912 B2* | 4/2016 | Chen | ........................ | H04B 3/20 |
| 2002/0047942 A1* | 4/2002 | Vorenkamp | ............ | H04N 5/455 348/731 |
| 2002/0119753 A1* | 8/2002 | Digiandomenico | ..... | H04B 3/23 455/570 |
| 2002/0151280 A1* | 10/2002 | Sabouri | ............... | H04L 25/0266 455/80 |
| 2003/0021389 A1* | 1/2003 | Hirai | ..................... | H04M 9/082 379/3 |
| 2003/0123650 A1* | 7/2003 | Ouyang | ................... | H04B 3/20 379/406.01 |
| 2003/0147526 A1* | 8/2003 | Oswal | ...................... | H04B 3/23 379/406.01 |
| 2003/0169806 A1* | 9/2003 | Warke | ................. | H04L 27/0002 375/222 |
| 2003/0169875 A1* | 9/2003 | Lee | .......................... | H04B 3/23 379/399.01 |

(Continued)

*Primary Examiner* — Andrew Lai
*Assistant Examiner* — Andrew C Lee
(74) *Attorney, Agent, or Firm* — McClure, Qualey & Rodack, LLP (57) ABSTRACT

A transceiver includes a first digital-to-analog converter (DAC) configured to receive a first digital code and output a first current to a first node; a second DAC configured to receive a second digital code and output a second current to a second node; first and second shunt resistors configured to shunt the first node and second nodes to a DC (direct current) node; a first DC coupling resistor coupling the first node to a third node; a second DC coupling resistor coupling the second node to the third node; an AC (alternate current) coupling capacitor coupling the third node to a fourth node; a transimpedance amplifier configured to receive an input current from the fourth node and output an output current to a fifth node; an inductive load configured to shunt the fifth node to a DC node; and an analog-to-digital conversion unit configured to receive a voltage at the fifth node and output a third digital code.

20 Claims, 3 Drawing Sheets

(56) References Cited

U.S. PATENT DOCUMENTS

2006/0146738 A1* 7/2006 Lu ............................ H04B 3/23
370/286
2018/0054166 A1* 2/2018 Pehlivanoglu ........ H03F 1/0266

* cited by examiner

HIGH-SPEED FULL-DUPLEX TRANSCEIVER AND METHOD THEREOF

BACKGROUND OF THE DISCLOSURE

Field of the Invention

The present invention generally relates to transceiver circuits and more particularly to high-speed full-duplex transceiver circuits.

Description of Related Art

A full-duplex transceiver is an apparatus comprising a transmitter and a receiver, wherein the transmitter is configured to transmit a first signal onto a media dependent interface, and the receiver is configured to receive a second signal concurrently from the same media dependent interface. In practice, a part of the first signal often leaks into the receiver and combines with the second signal to form a third signal, which is what the receiver receives and must process. The part of the first signal that leaks into the receiver is referred to as an "echo," which is a noise that impairs the receiver and needs to be suppressed. A hybrid circuit is usually used to allow the transmitter and the receiver to share the same media dependent interface and concurrently transmit the first signal and receive the second signal, respectively. In addition, the second signal received from the media dependent interface is originated from a remote transmitter and arrives at the media dependent interface via a communication media, for instance a cable, and usually suffers dispersion. Equalization to amend the dispersion is often required for the receiver, and therefore should be considered in the hybrid circuit design.

In U.S. Pat. No. 8,045,702, Lin et al. teach a hybrid circuit for use in a full-duplex transceiver to reduce the echo. The hybrid circuit disclosed thereof uses circuits such as active filter and ratio converter that are not amenable to high-speed applications. In U.S. Pat. No. 9,473,204, Lin et al. teach another hybrid circuit. Again, the hybrid circuit disclosed thereof requires using an operational amplifier, which is also not amenable to high-speed applications.

What is desired is a full-duplex transceiver amenable to high speed applications.

BRIEF SUMMARY OF THIS INVENTION

In an embodiment, a transceiver comprises: a first digital-to-analog converter (DAC) configured to receive a first digital code and output a first current to a first node, wherein the first node is a media-dependent interface for the transceiver to interface with a communication media; a second DAC configured to receive a second digital code and output a second current to a second node, wherein the second digital code is an inversion of the first digital code; a first shunt resistor configured to shunt the first node to a DC (direct current) node; a second shunt resistor configured to shunt the second node to a DC node; a first DC coupling resistor configured to couple the first node to a third node; a second DC coupling resistor configured to couple the second node to the third node; an AC (alternate current) coupling capacitor configured to couple the third node to a fourth node; a transimpedance amplifier configured to receive an input current from the fourth node and output an output current to a fifth node; an inductive load configured to shunt the fifth node to a DC node; and an analog-to-digital conversion unit configured to receive a voltage at the fifth node and output a third digital code.

In an embodiment, a method comprises: outputting a first current to a first node in accordance with a first digital code, wherein the first node is shunt to a DC (direct current) node via a first shunt resistor; outputting a second current to a second node in accordance with a second digital code, wherein the second digital code is an inversion of the first digital code, and the second node is shunt to a DC node via a second shunt resistor; coupling the first node to a third node using a first DC coupling resistor; coupling the second node to the third node using a second DC coupling resistor; coupling the third node to a fourth node using an AC (alternate current) coupling capacitor; outputting an output current to a fifth node using a transimpedance amplifier in accordance with an input current received from the fourth node; shunting the fifth node to a DC node with an inductive load; outputting a third digital code in accordance with a voltage at the fifth node; and interfacing with a communication media via the first node.

DETAILED DESCRIPTION OF THIS INVENTION

The present invention relates to full-duplex transceiver. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Persons of ordinary skill in the art understand terms and basic concepts related to microelectronics that are used in this disclosure, such as "(circuit) node," "ground (node)," "virtual ground," "signal," "voltage," "current," "Ohm's Law," "bias," "AC (alternate current) coupling," "DC (direct current) coupling," "capacitor," "capacitance," "resistor," "inductor," "transmission line," "CMOS (complementary metal oxide semiconductor)," "PMOS (P-channel metal oxide semiconductor) transistor," "NMOS (N-channel metal oxide semiconductor) transistor," "frequency," "shunt," "switch," "cascode," "impedance," "common-source amplifier," "common-gate amplifier," and "transimpedance amplifier." Terms and basic concepts like these are apparent to those of ordinary skill in the art and thus will not be explained in detail here. Those of ordinary skill in the art can also recognize symbols of PMOS transistor and NMOS transistor, and identify the "source," the "gate," and the "drain" terminals thereof.

A logical signal is a signal of two states: a first logical state (or a "high" state), and a second logical state (or a "low" state). When a logical signal is said to be high (low), it means it is in the "high" ("low") state, and it occurs when the logical signal is sufficiently above (below) a threshold level that is called a "trip point." Every logical signal has a trip point, and two logical signals may not necessarily have the same trip point.

The present disclosure is presented in an engineering sense. For instance, "X is equal to Y" means: "a difference between X and Y is smaller than a specified engineering tolerance." "X is substantially smaller than Y" means: "a ratio between X and Y is smaller than a specified engineering tolerance." For instance, in an embodiment, X is said to be substantially smaller than Y when a ratio between X and Y is smaller than three percent.

Figure 1:
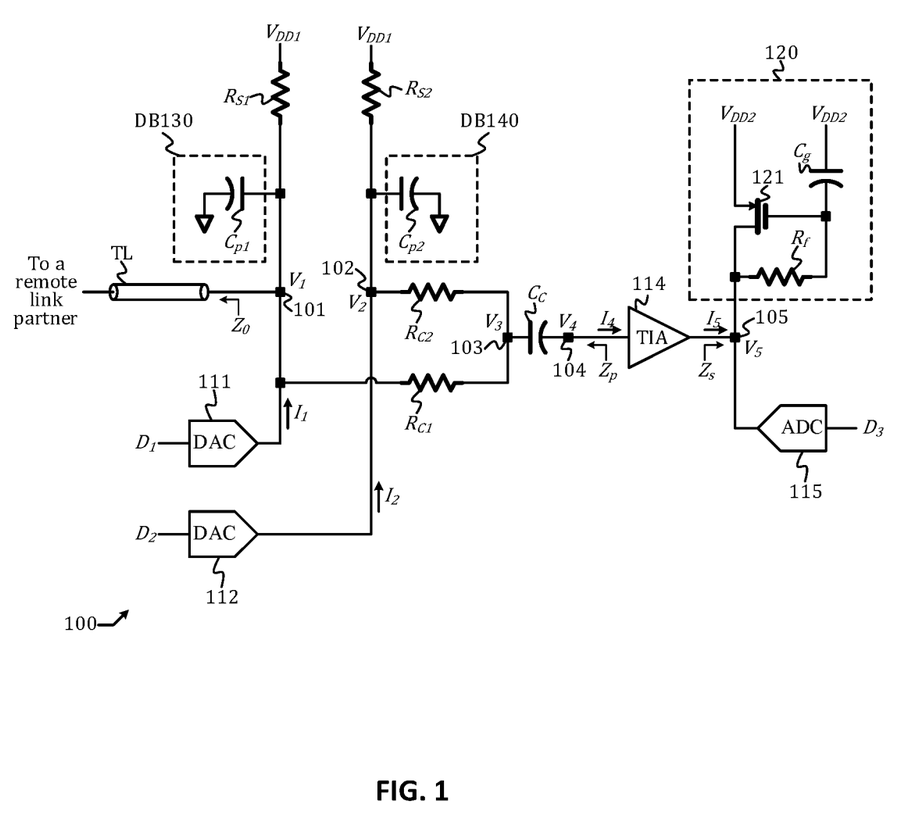
FIG. 1 shows a schematic diagram of a transceiver in accordance with an embodiment of the present disclosure.

As depicted in FIG. 1, a transceiver 100 in accordance with an embodiment of the present disclosure comprises: a first digital-to-analog converter DAC 111 configured to receive a first digital code $D_1$ and output a first current $I_1$ to a first node 101; a first shunt resistor $R_{S1}$ configured to shunt the first node 101 (of a first voltage denoted by "$V_1$") to a first power supply node denoted by "$V_{DD1}$"; a second digital-to-analog converter DAC 112 configured to receive a second digital code $D_2$ and output a second current $I_2$ to a second node 102 (of a second voltage denoted by "$V_2$"); a second shunt resistor $R_{S2}$ configured to shunt the second node 102 to "$V_{DD1}$"; a first DC (direct current) coupling resistor $R_{C1}$ configured to couple the first node 101 to a third node 103 (of a third voltage denoted by "$V_3$"); a second DC coupling resistor $R_{C2}$ configured to couple the second node 102 and the third node 103; an AC (alternate current) coupling capacitor $C_C$ configured to couple the third node 103 to a fourth node 104 (of a fourth voltage denoted by "$V_4$"); a TIA (transimpedance amplifier) 114 configured to receive an input current $I_4$ from the fourth node 104 and output an output current $I_5$ to a fifth node 105 (of a fifth voltage denoted by "$V_5$"); an inductive load 120 configured to shunt the fifth node 105 to a second power supply node denoted by "$V_{DD2}$"; an analog-to-digital conversion unit 115 configured to receive a fifth voltage $V_5$ at the fifth node 105 and output a third digital code $D_3$. The first node 101 is a media dependent interface for transceiver 100 to interface with a transmission line TL. The first digital code $D_1$ carries information to be sent to a remote link partner (which is also a transceiver) through the transmission line TL, while the third digital code $D_3$ represents information sent from the remote link partner through the transmission line TL and eventually decoded by transceiver 100. The second digital code $D_2$ is an inversion of the first digital code $D_1$ and is used for cancelling an echo resulting from the first digital code $D_1$. A principle of the cancellation is explained below.

$V_1$ can be decomposed into three components and mathematically represented by the following equation:

$$V_1 = V_{B1} + v_{1t} + v_{1r} \quad (1)$$

Here, $V_{B1}$ is a DC component of $V_1$; $v_{1t}$ is an AC component pertaining to information represented by the first digital code $D_1$ and to be sent to the remote link partner; and $V_{1r}$ is an AC component pertaining to the information received from the remote link partner and to be eventually resolved into the third digital code $D_3$.

$V_2$ can be decomposed into two components and mathematically represented by the following equation:

$$V_2 = V_{B2} + v_{ec} \quad (2)$$

Here, $V_{B2}$ is a DC component of $V_2$; $v_{ec}$ is an AC component pertaining to information represented by the second digital code $D_2$.

A transimpedance amplifier, such as TIA 114, is a device having a low input impedance and a high output impedance, wherein an input current received from a preceding circuit is substantially equal to an output current output to a succeeding circuit, as far as an AC component is concerned. In an embodiment, TIA 114 of FIG. 1 has an input impedance substantially lower than an impedance of the preceding circuit (denoted by $Z_p$) and an output impedance substantially higher than an impedance of the succeeding circuit (denoted by $Z_s$). Note that it is an engineering issue, instead of a rigorous theoretical issue, regarding how much lower (higher) can be said to be "substantially lower (higher)." In this disclosure, by way of example but not limitation, the input (output) impedance of TIA 114 is thirty-times lower (higher) than $Z_p$ ($Z_s$) and said to be "substantially lower (higher)" than $Z_p$ ($Z_s$) and thus negligible. Due to the low input impedance of TIA 114, the fourth node 104 is considered a "virtual ground" and $V_4$ is substantially stationary, i.e.

$$V_4 \approx V_{B4} \quad (3)$$

Here, $V_{B4}$ is an DC component of $V_4$, while an AC component of $V_4$ is omitted.

$C_C$ is an AC coupling capacitor of a substantially low impedance that can be deemed a short circuit at a frequency of interest in the communication link between transceiver 100 and the remote link partner. Therefore, the third node 103 can also be considered a "virtual ground" and $V_3$ is substantially stationary, i.e.

$$V_3 \approx V_{B3} \quad (4)$$

Here, $V_{B3}$ is a DC component of $V_3$, while an AC component of $V_3$ is omitted. By applying Kirchhoff's Voltage Law, we obtain $$V_{B3} = \frac{V_{B1}R_{C2} + V_{B2}R_{C1}}{R_{C1} + R_{C2}} \quad (5)$$

By applying the Ohm's law and Kirchhoff's Current Law on the AC components of $V_1$ and $V_2$, along with that third node 103 is a virtual ground, we obtain $$I_4 = \frac{v_{1t} + v_{1r}}{R_{C1}} + \frac{v_{ec}}{R_{C2}} \quad (6)$$

The first current $I_1$ can be expressed by the following equation $$I_1 = I_{B1} + D_1 I_{U1} \quad (7)$$

Here, $I_{B1}$ is a DC component of $I_1$, and $I_{U1}$ is a unit current of DAC 111.

The second current $I_2$ can be expressed by the following equation $$I_2 = I_{B2} + D_2 I_{U2} \quad (8)$$

Here, $I_{B2}$ is a DC component of $I_2$, and $I_{U2}$ is a unit current of DAC 112. As mentioned earlier, $D_2$ is an inversion of $D_1$, i.e.

$$D_2 = -D_1 \quad (9)$$

Let an impedance looking into the transmission line TL be represented by $Z_0$. By applying the Ohm's law on the AC component of $I_1$ and factoring in all the load impedance seen by $I_1$, yields the following:

$$v_{1r} = \frac{D_1 I_{U1}}{\frac{1}{Z_0} + \frac{1}{R_{S1}} + \frac{1}{R_{C1}}} \quad (10)$$

Similarly:

$$v_{ec} = \frac{D_2 I_{U2}}{\frac{1}{R_{S2}} + \frac{1}{R_{C2}}} \quad (11)$$

Applying equations (9), (10), and (11) to equation (6) yields:

$$I_4 = \frac{v_{1r}}{R_{C1}} + \frac{D_1 I_{U1}}{R_{C1} \cdot \left(\frac{1}{Z_0} + \frac{1}{R_{S1}} + \frac{1}{R_{C1}}\right)} - \frac{D_1 I_{U2}}{R_{C2} \cdot \left(\frac{1}{R_{S2}} + \frac{1}{R_{C2}}\right)} \quad (12)$$

On the right hand side of equation (12), the first term $$\frac{v_{1r}}{R_{C1}}$$

is pertaining to the information sent from the remote link partner to transceiver 100, the second term $$\frac{D_1 I_{U1}}{R_{C1} \cdot \left(\frac{1}{Z_0} + \frac{1}{R_{S1}} + \frac{1}{R_{C1}}\right)}$$

is an echo of DAC 111, while the third term $$\frac{D_1 I_{U2}}{R_{C2} \cdot \left(\frac{1}{R_{S2}} + \frac{1}{R_{C2}}\right)}$$

is a correction from DAC 112. In an embodiment, $I_{U2}$, $R_{S2}$, and $R_{C2}$ are chosen in accordance with $I_{U1}$, $R_{S1}$, $Z_0$, and $R_{C2}$ such that the following condition holds:

$$\frac{I_{U1}}{R_{C1} \cdot \left(\frac{1}{Z_0} + \frac{1}{R_{S1}} + \frac{1}{R_{C1}}\right)} = \frac{I_{U2}}{R_{C2} \cdot \left(\frac{1}{R_{S2}} + \frac{1}{R_{C2}}\right)} \quad (13)$$

Then, the third term $$\frac{D_1 I_{U2}}{R_{C2} \cdot \left(\frac{1}{R_{S2}} + \frac{1}{R_{C2}}\right)}$$

cancels me second term $$\frac{D_1 I_{U1}}{R_{C1} \cdot \left(\frac{1}{Z_0} + \frac{1}{R_{S1}} + \frac{1}{R_{C1}}\right)},$$

resulting in:

$$I_4 = \frac{v_{1r}}{R_{C1}}. \quad (14)$$

In this case, $I_4$ contains only the information sent from the remote link partner to transceiver 100, and the echo from DAC 111 is totally cancelled by the correction from DAC 112.

$I_5$ has the same AC value as $I_4$, thanks to the transimpedance amplifier TIA 114. By applying the Ohm's law:

$$V_5 = V_{B5} + \frac{v_{1r}}{R_{C1}} \cdot Z_s \quad (15)$$

Here, $V_{B5}$ is a DC component of $V_5$. The inductive load 120 comprises: a PMOS transistor 121 placed between the fifth node 105 and a second power supply node denoted by "$V_{DD2}$," a shunt capacitor $C_g$ placed across the gate of PMOS transistor 121 and "$V_{DD2}$," and a feedback resistor $R_f$ placed between the gate and the drain of the PMOS transistor 121. The inductive load 120 is a circuit known as an "active inductor." By neglecting a parasitic capacitance at the first node 101, the impedance $Z_s$ can be approximated by the following equation:

$$Z_s = \frac{1 + sR_f C_g}{g_m + sC_g} \quad (16)$$

Here, $g_m$ is a transconductance of PMOS transistor 121, and "s" is a Laplace transform variable. Applying equation (16) to equation (15) yields:

$$V_5 = V_{B5} + \frac{v_{1r}}{R_{C1}} \cdot \frac{1 + sR_f C_g}{g_m + sC_g} \quad (17)$$

In an embodiment, $g_m$ is greater than $1/R_f$. At a low frequency where $|sR_f C_g| \ll 1$, $V_5$ is approximately $$V_{B5} + \frac{v_{1r}}{R_{C1} g_m}.$$

At a high frequency where $|sC_g| \gg g_m$, $V_5$ is approximately $$V_{B5} + \frac{v_{1r} \cdot R_f}{R_{C1}}.$$

Since $g_m$ is greater than $1/R_f$, a higher frequency component of $v_{1r}$ will enjoy a higher gain than a lower frequency component; this can fulfill an equalization function that is needed. In an embodiment, one of $R_f$ and $C_g$ is adjustable and adjusted in accordance with a dispersion of the transmission line TL. For instance, when the transmission TL has higher insertion loss at a high frequency, $R_f$ is adjusted to be larger.

By way of example but not limitation, transceiver 100 is fabricated using a 28 nm CMOS (complementary metal oxide semiconductor) process: a baud rate of the full-duplex communication between transceiver 100 and the remote link partner is 5.625 GHz; $Z_0$ is 50-Ohm; $V_{DD1}$ is 1.8V; $R_{S1}$ is 60 Ohm; $I_{B1}$ is 10 mA; $I_{U1}$ is 20 mA/3; $D_1$ represents a PAM-4 (4-level pulse-amplitude modulation) signal that has four possible values: $\{-3, -1, 1, 3\}$; $R_{S2}$ is 240 Ohm; $I_{B2}$ is 2.5 mA; $I_{U2}$ is 5 mA/3; $R_{C1}$ is 300-Ohm; $R_{C2}$ is 480 Ohm; $C_C$ is 10 pF; $R_f$ is 2 KOhm; $C_g$ is 100 fF; the width/length of PMOS transistor 121 are 20 μm/30 nm; and $V_{DD2}$ is 0.9V.

Figure 2:
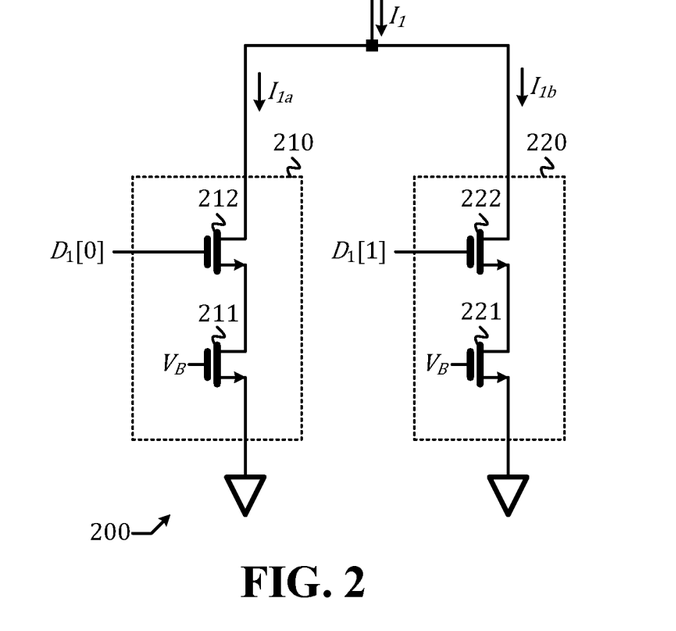
FIG. 2 shows a schematic diagram of a two-bit digital-to-analog converter.

A two-bit digital-to-analog converter 200 suitable for implementing DAC 111 is shown in FIG. 2. Here, the first digital code $D_1$ is a two-bit code comprising a LSB (least significant bit) $D_1[0]$ and a MSB (most significant bit) $D_1[1]$. Digital-to-analog converter 200 comprises a first current cell 210 and a second current cell 220 configured to output a first output current $I_{1a}$ and a second output current $I_{1b}$ in accordance with $D_1[0]$ and $D_1[1]$, respectively. The first current cell 210 comprises two NMOS transistors 211 and 212 configured in a cascode topology, wherein NMOS transistor 211 embodies a current source biased by a biasing voltage $V_B$ and NMOS transistor 212 embodies a switch used to either turn on or turn off the first current cell 210 in accordance with a control by $D_1[0]$. The second current cell 220 comprises two NMOS transistors 221 and 222 configured in a cascode topology, wherein NMOS transistor 221 embodies a current source biased by the biasing voltage $V_B$ and NMOS transistor 222 embodies a switch used to either turn on or turn off the second current cell 220 in accordance with a control by $D_1[1]$. Both $D_1[0]$ and $D_1[1]$ are logical signals. By way of example but not limitation: $I_{1a}$ is equal to 20 mA/3 (0 mA) when $D_1[0]$ is high (low); and $I_{1b}$ is equal to 40 mA/3 (0 mA) when $D_1[1]$ is high (low). An encoding scheme for $D_1$ is shown in the table below:

| $D_1$ | −3 | −1 | 1 | 3 |
|---|---|---|---|---|
| $D_1[0]$ | low | high | Low | high |
| $D_1[1]$ | low | low | High | high |

Here, "high" and "low" are pertaining to logical states; by way of example but not limitation, "high" and "low" states are of 0.9V and 0V, respectively. By applying the above encoding scheme, the resultant values for $I_{1a}$, $I_{1b}$, and $I_1$ is obtained (which is a sum of $I_{1a}$ and $I_{1b}$):

| $D_1$ | −3 | −1 | 1 | 3 |
|---|---|---|---|---|
| $I_{1a}$ | 0 mA | 20 mA/3 | 0 mA | 20 mA/3 |
| $I_{1b}$ | 0 mA | 0 mA | 40 mA/3 | 40 mA/3 |
| $I_1$ | 0 mA | 20 mA/3 | 40 mA/3 | 20 mA |

This way, equation (7) is satisfied with $I_{B1}=10$ mA and $I_{U1}=10$ mA/3.

By way of example but not limitation, the width/length of NMOS transistor 211 are 30 μm/90 nm; the width/length of NMOS transistor 212 are 30 μm/90 nm; the width/length of NMOS transistor 221 are 60 μm/90 nm; the width/length of NMOS transistor 222 are 60 μm/90 nm; and $V_B$ is 600 mV.

The same circuit topology of the two-bit digital-to-analog converter 200 can be used to embody DAC 112, but all transistor widths need to be reduced by a proper factor to reflect the difference between $I_1$ and $I_2$. Also, $D_1[0]$ and $D_1[1]$ are replaced by $D_2[0]$ and $D_2[1]$ with the following encoding scheme for $D_2$:

| $D_2$ | −3 | −1 | 1 | 3 |
|---|---|---|---|---|
| $D_2[0]$ | low | high | low | high |
| $D_2[1]$ | low | low | high | high |

Figure 3:
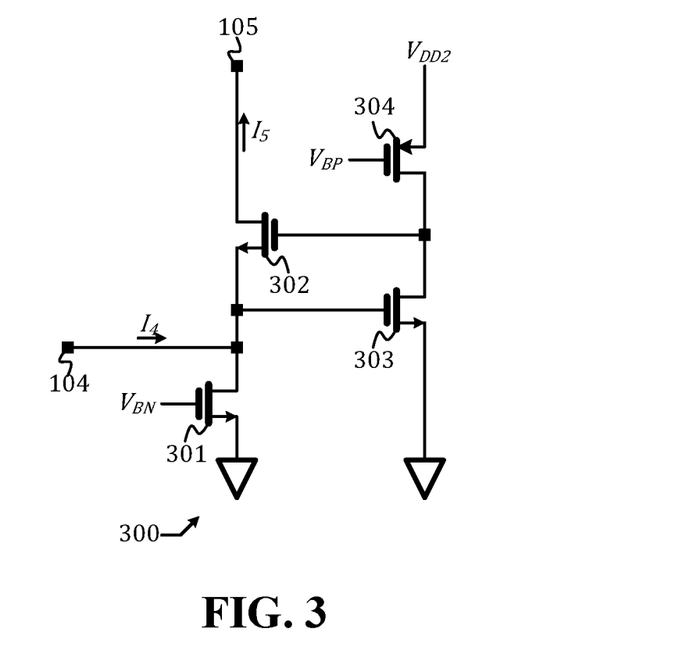
FIG. 3 shows a schematic diagram of a transimpedance amplifier.

A transimpedance amplifier 300 that can be used to embody TIA 114 of FIG. 1 is shown in FIG. 3. Transimpedance amplifier 300 comprises: three NMOS transistors 301, 302, and 303, and a PMOS transistor 304. NMOS transistor 302 embodies a common-gate amplifier; NMOS transistor 301 embodies a current source configured to bias the common-gate amplifier in accordance with a biasing condition determined by a bias voltage $V_{BN}$; NMOS transistor 303 embodies a common-source amplifier configured to provide a negative feedback from the source to the gate of NMOS transistor 302 to embody a gain boosting function for the common-gate amplifier; and PMOS transistor 304 embodies a load for the common-source amplifier with a load resistance controlled by another bias voltage $V_{BP}$. The gain boosting provided by the common-source amplifier helps to reduce an input impedance of the common-gate amplifier at node 104. Transimpedance amplifier 300 is well known in the prior art and thus not explained in detail here.

Now refer to FIG. 1. The first node 101 is a media-dependent interface that in practice usually has an appreciable parasitic capacitance. Capacitor $C_{p1}$ inside dashed-box DB130 models a parasitic capacitance at the first node 101. The existence of capacitor $C_{p1}$ introduces a pole at the first node 101 and alters the second term of the right-hand side of equation (12). This can lead to degradation of performance of echo cancellation. To mitigate the degradation, a shunt capacitor $C_{p1}$ shown inside dashed-box DB140 is introduced at the second node 102, and equation (12) is modified as follows:

$$I_4 = \frac{v_{1r}}{R_{C1}} + \frac{D_1 I_{U1}}{R_{C1} \cdot \left(\frac{1}{Z_0} + \frac{1}{R_{S1}} + \frac{1}{R_{C1}} + sC_{p1}\right)} - \frac{D_1 I_{U2}}{R_{C2} \cdot \left(\frac{1}{R_{S2}} + \frac{1}{R_{C2}} + sC_{p2}\right)} \quad (18)$$

In an embodiment, $C_{p1}$ is chosen in accordance with $C_{p1}$ such that the following condition holds:

$$\frac{I_{U1}}{R_{C1} \cdot \left(\frac{1}{Z_0} + \frac{1}{R_{S1}} + \frac{1}{R_{C1}} + sC_{p1}\right)} = \frac{I_{U2}}{R_{C2} \cdot \left(\frac{1}{R_{S2}} + \frac{1}{R_{C2}} + sC_{p2}\right)} \quad (19)$$

Then, the third term $$\frac{D_1 I_{U2}}{R_{C2} \cdot \left(\frac{1}{R_{S2}} + \frac{1}{R_{C2}} + sC_{p2}\right)}$$

cancels the second term $$\frac{D_1 I_{U1}}{R_{C1} \cdot \left(\frac{1}{Z_0} + \frac{1}{R_{S1}} + \frac{1}{R_{C1}} + sC_{p1}\right)}$$

despite the existence of $C_{p1}$.

In FIG. 1, ADC 115 converts $V_s$ into $D_3$. An analog-to-digital conversion is a function that converts a signal in an analog domain (e.g. $V_5$) to a signal in a digital domain (e.g. $D_3$) and is well known in the prior art and thus not described in detail here. However, ADC 115 is a functional block that embodies analog-to-digital conversion function, but does not necessarily need to be a single analog-to-digital converter circuit. An analog-to-digital conversion function takes a signal in analog domain and converts it into a counterpart in digital domain. It might further include a pre-amplifier in the analog domain for receiver's gain control purpose. It might further include a pre-filter in the analog domain. It might further include a post-processing filter in the digital domain after the analog signal is converted to a digital counterpart. Pre-filter (such as continuous-time linear equalizer anti-alias filtering) and post processing filter (such as decision feedback equalizer) are often needed to make $D_3$ accurately represent the information sent from the remote link partner. Since there are numerous possibilities, they are not exhaustively stated here.

Transceiver 100 is a single-ended signaling embodiment. By combining two single-ended signaling embodiments, a differential signaling embodiment can be implemented.

Although it is shown that both $R_{S1}$ and $R_{S2}$ connect to the same power supply node "$V_{DD1}$," this is merely an example but not a limitation. As well, power supplies nodes "$V_{DD1}$" and "$V_{DD2}$" are circuits nodes that have substantially fixed electrical potentials, and can be described as "DC nodes," as the voltages thereof contain negligible AC components. Further, a ground node can also be described as a DC node.

In an alternative embodiment not shown in figure, the inductive load 120 is replaced with a serial connection of a passive inductor and a resistor. A passive inductor may have better linearity than an active inductor, but it usually occupied more circuit area and is thus more expensive.

There are no operational amplifiers in the signal paths of transceiver 100, and all the circuits can be comfortably implemented for baud rate of 5.625 GHz as shown in the example given earlier.

Figure 4:
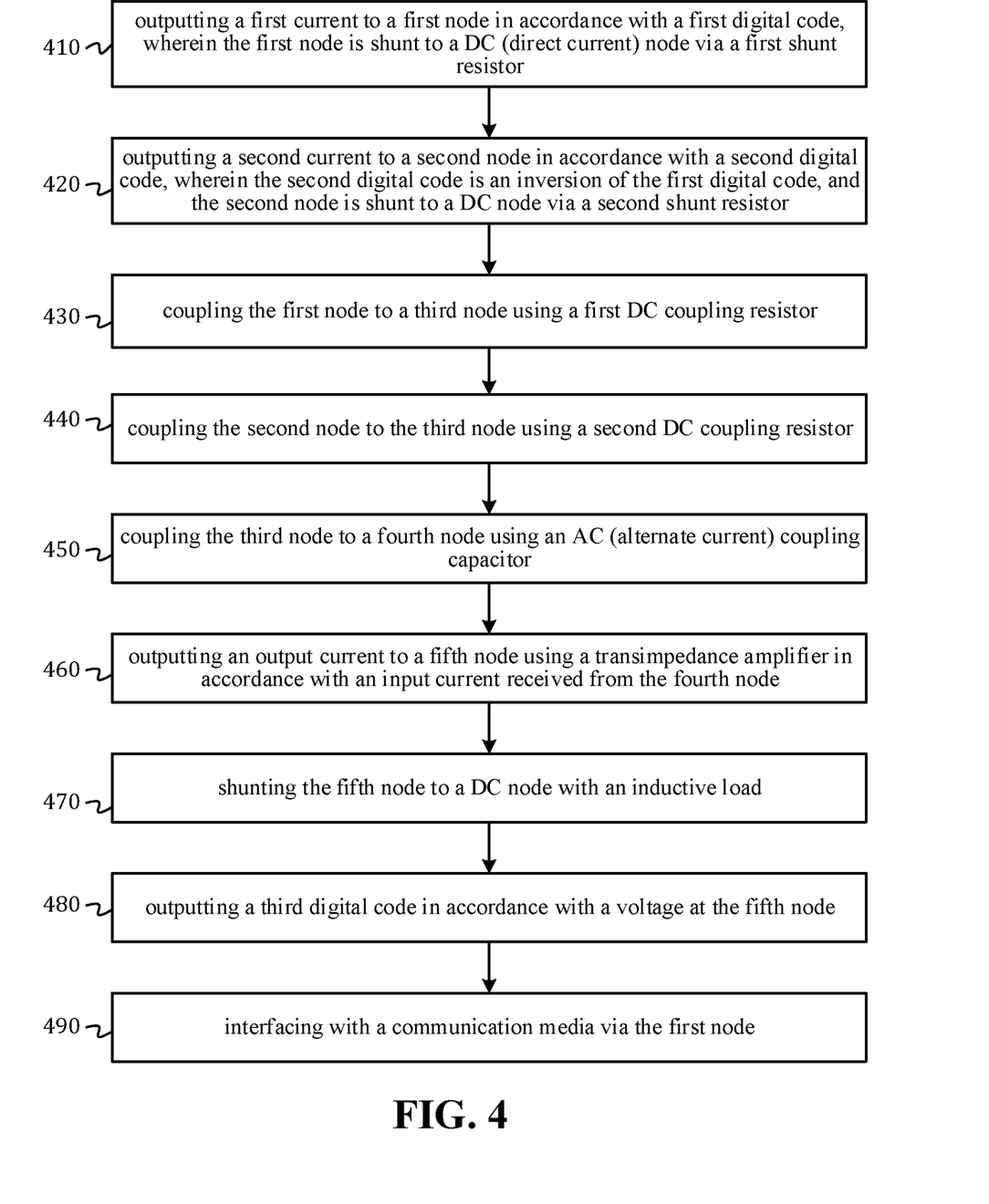
FIG. 4 shows a flow diagram of a method in accordance with an embodiment of the present disclosure.

As illustrated by a flow diagram shown in FIG. 4, a method in accordance with an embodiment of the present disclosure comprises the following steps: (step 410) outputting a first current to a first node in accordance with a first digital code, wherein the first node is shunt to a DC (direct current) node via a first shunt resistor; (step 420) outputting a second current to a second node in accordance with a second digital code, wherein the second digital code is an inversion of the first digital code, and the second node is shunt to a DC node via a second shunt resistor; (step 430) coupling the first node to a third node using a first DC coupling resistor; (step 440) coupling the second node to the third node using a second DC coupling resistor; (step 450) coupling the third node to a fourth node using an AC (alternate current) coupling capacitor; (step 460) outputting an output current to a fifth node using a transimpedance amplifier in accordance with an input current received from the fourth node; (step 470) shunting the fifth node to a DC node with an inductive load; (step 480) outputting a third digital code in accordance with a voltage at the fifth node; and (step 490) interfacing with a communication media via the first node.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A transceiver comprising:
a first digital-to-analog converter (DAC) configured to receive a first digital code and output a first current to a first node, wherein the first node is a media-dependent interface for the transceiver to interface with a communication media;
a second DAC configured to receive a second digital code and output a second current to a second node, wherein the second digital code is an inversion of the first digital code;
a first shunt resistor configured to shunt the first node to a first DC (direct current) node;
a second shunt resistor configured to shunt the second node to the first DC node;
a first DC coupling resistor configured to couple the first node to a third node;
a second DC coupling resistor configured to couple the second node to the third node;
an AC (alternate current) coupling capacitor configured to couple the third node to a fourth node;
a transimpedance amplifier configured to receive an input current from the fourth node and output an output current to a fifth node;
an inductive load configured to shunt the fifth node to a second DC node; and
an analog-to-digital conversion circuit configured to receive a voltage at the fifth node and output a third digital code.

2. The transceiver of claim 1 further includes a shunt capacitor configured to shunt the second node to the second DC node.

3. The transceiver of claim 1, wherein the inductive load is an active inductor.

4. The transceiver of claim 3, wherein the inductive load is adjustable and adjusted in accordance with a dispersion of the communication media.

5. The transceiver of claim 1, wherein the inductive load comprises a serial connection of a passive inductor and a resistor.

6. The transceiver of claim 1, wherein the transimpedance amplifier comprises a common-gate amplifier.

7. The transceiver of claim 6, wherein the transimpedance amplifier further includes a common-source amplifier configured to provide a gain boosting for the common-gate amplifier.

8. The transceiver of claim 1, wherein the analog-to-digital conversion circuit includes a pre-amplifier in an analog domain.

9. The transceiver of claim 8, wherein the analog-to-digital conversion circuit includes a pre-filter in the analog domain.

10. The transceiver of claim 9, wherein the analog-to-digital conversion circuit includes a post processing filter in a digital domain.

11. A method comprising the following steps:
outputting a first current to a first node in accordance with a first digital code, wherein the first node is shunt to a first DC (direct current) node via a first shunt resistor;
outputting a second current to a second node in accordance with a second digital code, wherein the second digital code is an inversion of the first digital code, and the second node is shunt to the first DC node via a second shunt resistor;
coupling the first node to a third node using a first DC coupling resistor;
coupling the second node to the third node using a second DC coupling resistor;
coupling the third node to a fourth node using an AC (alternate current) coupling capacitor;
outputting an output current to a fifth node using a transimpedance amplifier in accordance with an input current received from the fourth node;
shunting the fifth node to a second DC node with an inductive load;
outputting a third digital code in accordance with a voltage at the fifth node; and
interfacing with a communication media via the first node.

12. The method of claim 11, wherein the second node is shunt to the second DC node via a shunt capacitor.

13. The method of claim 11, wherein the inductive load is an active inductor.

14. The method of claim 13, wherein the inductive load is adjustable and adjusted in accordance with a dispersion of the communication media.

15. The method of claim 11, wherein the inductive load comprises a serial connection of a passive inductor and a resistor.

16. The method of claim 11, wherein the transimpedance amplifier comprises a common-gate amplifier.

17. The method of claim 16, wherein the transimpedance amplifier further includes a common-source amplifier configured to provide a gain boosting for the common-gate amplifier.

18. The method of claim 11, wherein the step of outputting the third digital code includes using a pre-amplifier in an analog domain.

19. The method of claim 18, wherein the step of outputting the third digital code includes using a pre-filter in an the domain.

20. The method of claim 19, wherein step of outputting the third digital code includes a post processing filter in a digital domain.

* * * * *